(12) United States Patent
Stevens

(10) Patent No.: US 6,191,599 B1
(45) Date of Patent: Feb. 20, 2001

(54) IC DEVICE UNDER TEST TEMPERATURE CONTROL FIXTURE

(75) Inventor: Keith C. Stevens, Fairfield, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/169,073

(22) Filed: Oct. 9, 1998

(51) Int. Cl.[7] ................................... G01R 31/26
(52) U.S. Cl. .......................... 324/760; 324/765
(58) Field of Search .................. 324/760, 765, 324/754; 165/80.3

(56) References Cited

U.S. PATENT DOCUMENTS

| | | | |
|---|---|---|---|
| 3,560,849 | 2/1971 | Ryan et al. | 324/419 |
| 4,115,736 | 9/1978 | Tracy | 324/760 |
| 4,229,066 | 10/1980 | Rancourt et al. | 359/359 |
| 4,426,619 | 1/1984 | Demand | 324/760 |
| 4,583,040 | 4/1986 | Hata et al. | 324/54 |
| 4,962,355 | * 10/1990 | Holderfield et al. | 324/760 |
| 5,278,495 | 1/1994 | Beaton et al. | 324/158.1 |
| 5,327,075 | * 7/1994 | Hashinaga et al. | 324/158.1 |

FOREIGN PATENT DOCUMENTS 62-11243   1/1987   (JP) .

OTHER PUBLICATIONS

IBM Technical Disclosure Bulletin, vol. 12 No. 6, Nov. 1969, Electro–Optical Probe, L. Laczko and S. Oktay.

* cited by examiner

Primary Examiner—Safet Metjahic
Assistant Examiner—Russell M. Kobert
(74) Attorney, Agent, or Firm—Scully, Scott, Murphy & Presser; Howard J. Walter, Esq.

(57) ABSTRACT

A temperature control fixture for an integrated circuit under test which provides for heating or cooling of the back side of the integrated circuit while it is being tested by contacts and electrical leads applied to the opposite lead side thereof. A test housing defines a sealed test chamber within which a test mounting is provided for mounting the integrated circuit under test. The test mounting is connected to a plurality of test lines for conducting test signals between the lead side of the integrated circuit and a test instrument external to the test apparatus. The integrated circuit is mounted on the test mounting to expose the back side thereof to a flow of a heat transfer medium in the sealed test chamber to provide for cooling or heating thereof. An observation window in the test housing enables observation of the back side of device during testing.

9 Claims, 2 Drawing Sheets

IC DEVICE UNDER TEST TEMPERATURE CONTROL FIXTURE

BACKGROUND OF THE INVENTION

1. Field of the Invention

The present invention relates generally to a temperature control fixture for an integrated circuit (IC) Device Under Test (DUT), and more particularly pertains to a temperature control fixture which provides for cooling or heating of one side of an integrated circuit which is being tested by contacts and electrical leads applied to the opposite side thereof.

2. Discussion of the Prior Art

Prior art test fixtures for integrated circuits have not provided for suitable testing of an integrated circuit which must be cooled or heated from the same side as it is being viewed during testing.

Moreover, such prior art test fixtures have not adequately controlled thermal expansion gradients which can cause fracturing of thinned, active integrated circuits. This problem arises when active, power dissipating devices are nonuniformly distributed on the integrated circuit and the structural strength of the integrated circuit is reduced due to thinning.

Other problems arise from heating of the viewing optics and camera by thermal infrared (IR) radiation, which can cause camera noise and possible damage to the integrated circuit.

The present invention provides a solution to a problem which arises when an integrated circuit must be heated or cooled from the same side as it is being viewed during testing.

The problem confronting the present invention is that for testing purposes, one would like to apply test signals to an integrated circuit silicon chip from the electrical lead side thereof while observing the opposite side of the silicon chip. During such testing; any defects in the integrated circuit silicon chip, such as shorts in the silicon gate areas, are likely to emit radiation in the near infrared portion of the spectrum (generally from 0.7 to 0.5 microns). The defects provide mechanisms similar to those in an LED (Light Emitting Diode) to generate and emit such radiation in the near infrared portion of the spectrum.

This testing requires the application of test signals to the electrical leads in the lead side of the integrated circuit silicon ship under normal application, heat stabilized conditions. However, under normal heat stabilized conditions the opposite side of the integrated circuit silicon chip is in contact with a heat sink to enable the chip to function in a normal thermally stabilized manner.

To observe the opposite side of the integrated circuit silicon chip requires removal of the normal heat sink applied thereto.

SUMMARY OF THE INVENTION

The present invention compensates for removal of the normal heat sink by immersing the side of the chip which is opposite the electrical lead side thereof in a coolant heat transfer medium to cool the chip in a manner to enable normal thermally stabilized operation thereof. An observation window in the test chamber allows the opposite surf side of the chip to be observed through the coolant heat transfer medium during testing of the chip. The observation window is designed to pass radiation in the near infrared portion of the spectrum while blocking radiation (heat) in the far infrared portion of the spectrum (above 2 microns), which would merely add noise to the portions of the spectrum desired to be observed.

It is a primary object of the present invention to provide a temperature control fixture for an integrated circuit under test which provides for heating or cooling of one side of the integrated circuit while it is being tested by contacts and electrical leads applied to the opposite side of the integrated circuit.

The subject invention also solves a problem with thermal expansion gradients which can cause fracturing of thinned, active integrated circuits which have active, power dissipating devices nonuniformly distributed thereon.

Other problems arise from heating of the camera and viewing optics by thermal infrared (IR) radiation, which can cause camera noise and possible damage to the integrated circuit. A heat blocking observation window is provided to control these problems. The observation window is designed as a radiation filter to pass radiation above a given wavelength and block infrared radiation below that wavelength (i.e. far infrared radiation at wavelengths above 2 microns).

The present invention:

provides a controllable temperature environment for a device under test (DUT);

reduces the chances of fracture of a thinned device under test (DUT) caused by thermal gradients;

fills possible normal operational requirements for a heat sink for a device under test (DUT);

increases the accuracy of measurement of the environment temperature of the device under test (DUT);

increases the light transmission through the back surface of the device under test (by approximately 30%). The present invention accomplishes this by matching the index of refraction of the heat transfer medium to the indices of refraction of the integrated circuit silicon chip and the observation window.

The design benefits of the disclosed testing apparatus include:

a low profile; economic usage of materials, e.g. the infrared blocking window also functions to contain the heat transfer medium in the test chamber;

reduces or eliminates thermal effects on the optics and the camera, reducing noise from those components;

reduces thermal air turbulence effects on image quality, resulting in more accurate testing;

removes air bubbles in the heat transfer medium which can obstruct vision through the observation window.

In accordance with the teachings herein, the present invention provides a test apparatus for testing a device under test which comprises a test housing defining a sealed test chamber therein. A test mounting is provided for mounting the device under test within the test chamber, and is connected to a plurality of test lines for conducting test signals between a lead side of the device under test and a test instrument external to the test apparatus. The device under test is mounted on the test mounting to expose the opposite side thereof to a flow of coolant in the sealed test chamber to provide for cooling or heating of the opposite side thereof. An observation window in the test housing enables observation of the opposite side of the device during testing. A flow of a temperature-controlled heat transfer medium is introduced into and through the sealed test chamber to immerse the device under test in the flow of the heat transfer medium to control the temperature thereof.

In greater detail, the test control fixture provides for heating or cooling of one side of the device under test which is being tested by contacts and electrical leads applied to an opposite side of the device under test. The device under test comprises an integrated circuit, and the test mounting mounts the integrated circuit with a side thereof immersed in and exposed to the flow of the heat transfer medium, and with conductive leads extending to an opposite electrical lead side thereof which are plugged into female electrical contacts of the test mounting. The test mounting comprises a test socket attached to electrical cables having a plurality of wires to conduct input and output test signals between the device under test and an external test instrument or instruments. Moreover, a far infrared blocking window is provided on one side of the sealed test cavity to enable observation of the surf side of the integrated circuit.

The test control fixture can comprise an upper housing positioned on top of a lower housing, wherein the upper housing is sealed relative to the lower housing by a seal positioned therebetween and around the sealed test chamber. The lower housing defines a lower rectangular shaped recess and an upper slightly larger, rectangular shaped recess. The test mounting is fixedly mounted within the lower recess such that the device under test is mounted on the test mounting and extends into the upper recess through which the heat transfer medium flows.

The temperature of the heat transfer medium is maintained relatively constant by feedback control of a heating/cooling unit by a thermocouple positioned in the test chamber.

The test control fixture also increases the light transmission through the back surface of the device under test by matching the index of refraction of the heat transfer medium to the indices of refraction of the device under test and the observation window, by being selected to be between the indices of refraction of the device under test and the observation window.

BRIEF DESCRIPTION OF THE DRAWINGS

The foregoing objects and advantages of the present invention for a temperature control fixture for an integrated circuit device under test may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE DRAWINGS

Figure 1:
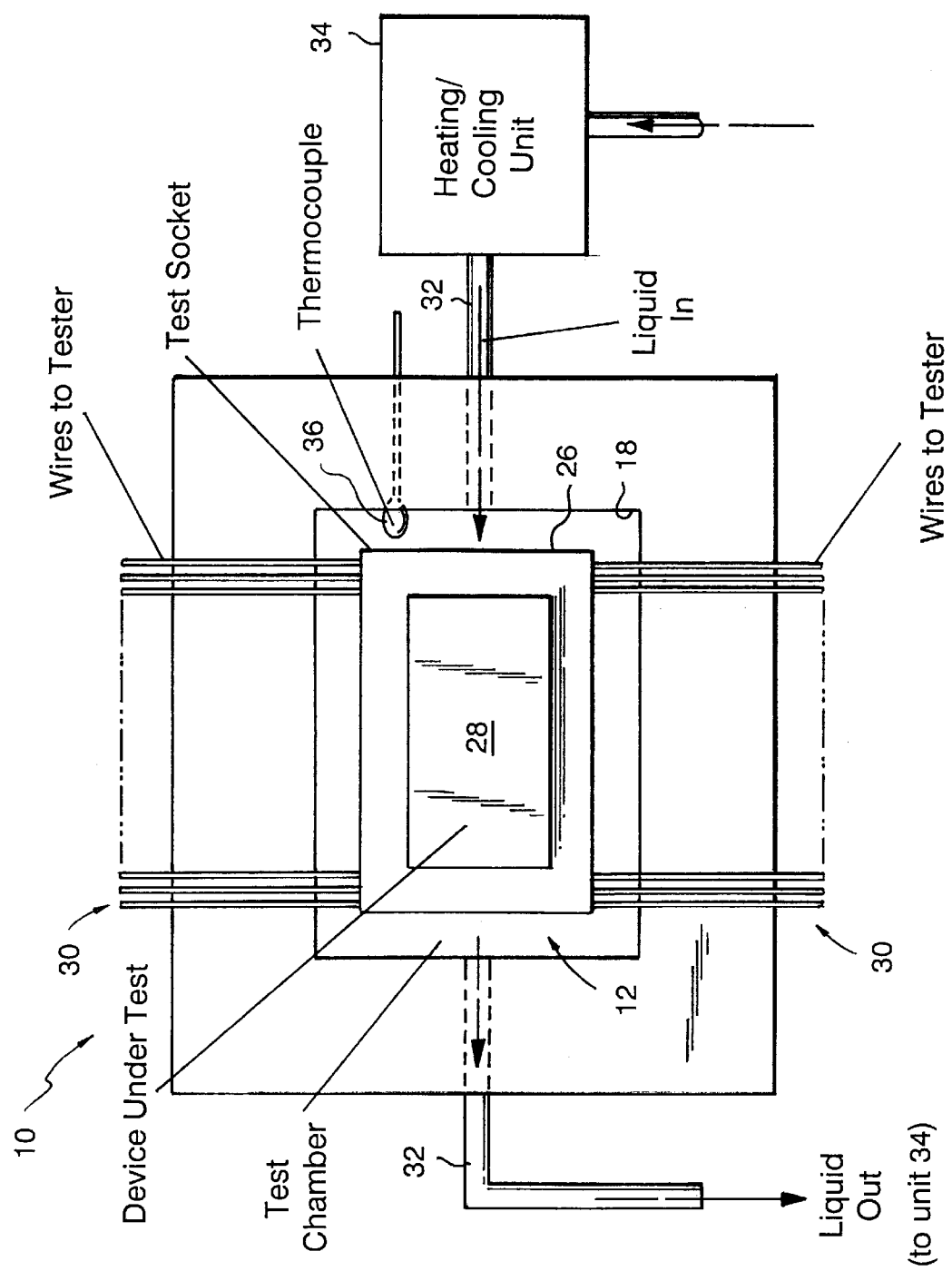
FIG. 1 is a top plan view of a temperature controlled test fixture constructed pursuant to the teachings of the present invention.
Figure 2:
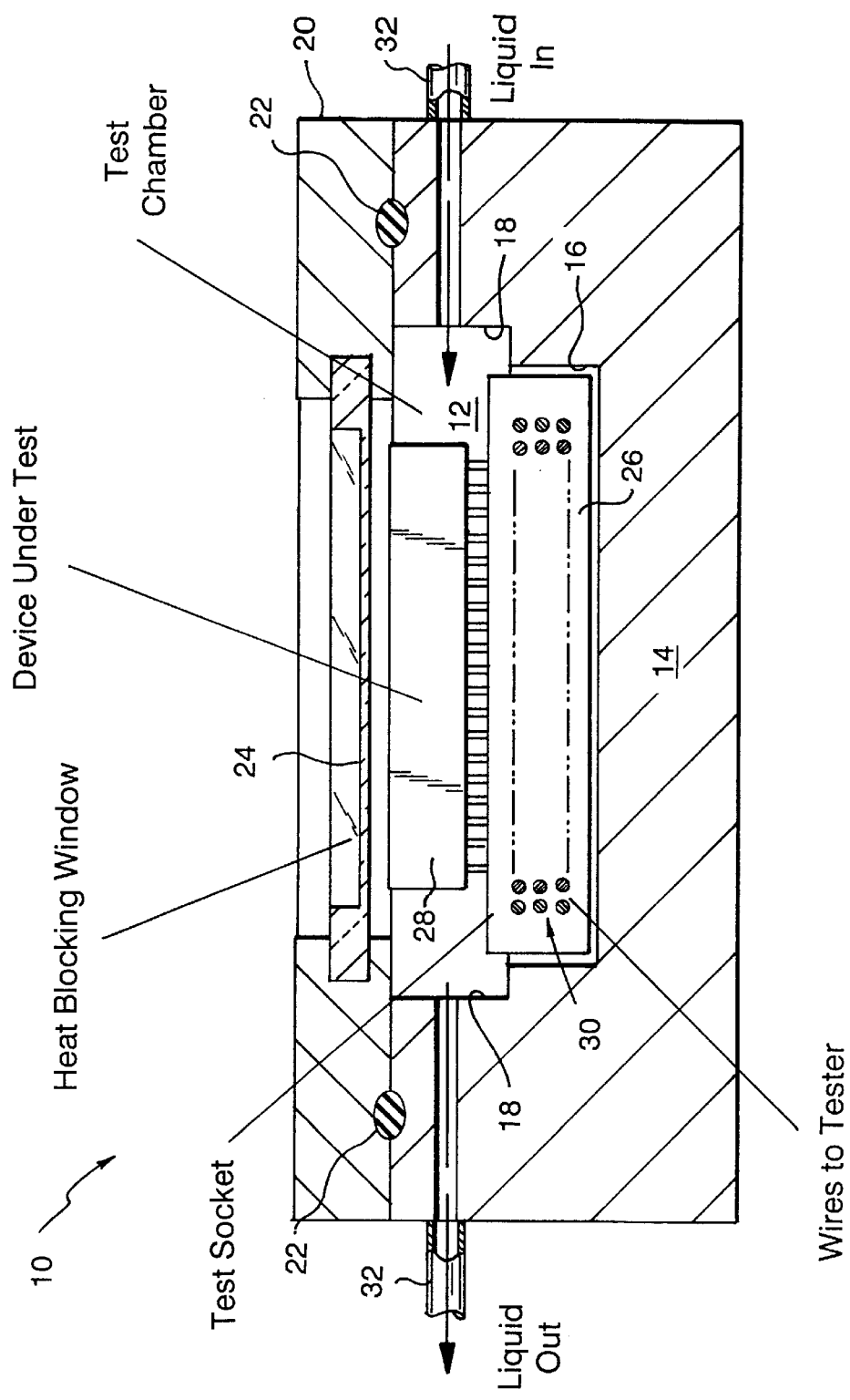
FIG. 2 is a side elevational view of the temperature controlled test fixture of FIG. 1 of the present invention.

Referring to the drawings in detail, FIGS. 1 and 2 are respectively a top plan view and a side elevational view of a temperature controlled test fixture 10 constructed pursuant to the teachings of the present invention.

The test apparatus 10 includes a test chamber 12 defined within a lower housing 14 having a lower rectangular shaped recess 16 and an upper slightly larger, rectangular shaped recess 18. An upper housing 20 is positioned on top of the lower housing 14, and is sealed relative thereto by an O ring seal 22 positioned therebetween around the sealed test chamber 12. The upper housing 20 includes an observation window 24 sealed in place therein which is designed to block far infrared radiation. The window functions as a radiation filter to pass near infrared radiation above a given wavelength (2 microns) and block far infrared radiation below that wavelength (i.e., heat).

A test socket 26 is positioned in the sealed test cavity 12, and serves to mount a device under test (DUT) 28 in the sealed test chamber or cavity. The test socket 26 is attached to cables 30 on opposite sides thereof which include a plurality of wires to conduct input and output test signals between the device under test (DUT) and an external test conducting and/or monitoring instrument or instruments. The test mounting or socket 26 is fixedly mounted within the lower recess 16 as by being potted therein, and the integrated circuit under test 28 is plugged into the top of the test socket 26 such that it is mounted thereon for testing.

The device under test (DUT) is cooled or heated by a heat transfer medium 32 which is pumped through the sealed test chamber such that the device under test (DUT) 28 is immersed therein and heated or cooled thereby. The heat transfer medium is preferably an optical quality, chemically inert fluid having a large thermal capacity (coefficient of thermal conduction), such as an optical immersion oil. The fluid is precooled (or preheated in alternative embodiments) prior to being pumped around the device under test (DUT) positioned in the test control fixture. The temperature thereof is maintained relatively constant by feedback control of a heating/cooling unit 34 by a thermocouple 36 positioned in the test chamber.

The heat transfer medium is selected to have an index of refraction to minimize optical losses in the test apparatus, which effectively increases the light transmission through the back surface of the device under test. Optical losses at the interface between components having different indices of refraction are reduced by matching the index of refraction of the heat transfer medium to the indices of refraction of the device under test and the observation window, by being selected to be between the indices of refraction of the device under test and the observation window.

Air has an index of refraction of 1.0, while glass typically has an index of refraction of 1.5, silicon typically has an index of refraction of 3.5. The index of refraction of the optical immersion oil is selected to be in the range between that of the glass observation window (1.5) and that of the silicon chip (3.5), and is typically around 1.5.

The present invention provides a controllable temperature environment for a device under test (DUT). The controllable temperature environment reduces the chances of fracture of a thinned device under test (DUT) from thermal gradients, can fulfill a normal operational requirement for a heat sink for a device under test (DUT), increases the environmental temperature measurement accuracy for a device under test (DUT), and increases the light transmission through the back surface of the device under test (by approximately 30%).

The disclosed test provides chamber design benefits of a low profile, economic usage of materials, an infrared blocking window which is also used to contain a heat transfer medium, reduces or eliminates thermal effects on the optics and camera, reduces thermal air turbulence effects on image quality, and removes air bubbles in the heat transfer medium from in front of the observation window.

While a preferred embodiment of the present invention for a temperature control fixture for an integrated circuit device under test (DUT) are described in detail herein, it should be apparent that the disclosure and teachings of the present invention will suggest many alternative designs to those skilled in the art.

Having thus described our invention, what we claim as new, and desire to secure by Letters Patent is:

1. A test apparatus for testing a device under test, comprising:

a. a test housing defining a sealed test chamber therein;

b. a test mounting for mounting the device under test within the test chamber, the test mounting being connected to a plurality of test lines for conducting test signals to a lead side of the device under test, which is mounted on the test mounting to expose a side of the device opposite the lead side under test in the sealed test chamber to provide for cooling or heating of the surf side of the device under test;

c. an observation window mounted in the test housing to enable observation of the opposite side of the device under test;

d. means for introducing a flow of a heat transfer medium into and through the sealed test chamber to immerse the opposite side of the device under test in the flow of the heat transfer medium to control the temperature thereof.

2. A test apparatus for testing a device under test as claimed in claim 1, wherein the device under test is an integrated circuit, and the test mounting mounts the integrated circuit with the opposite side of the integrated circuit immersed in and exposed to the flow of the heat transfer medium and with conductive leads extending from the opposite lead side of the integrated circuit plugged into female electrical contacts of the test mounting.

3. A test apparatus for testing a device under test as claimed in claim 1, wherein the test mounting comprises a test socket attached to the plurality of test lines to conduct input and output test signals between the device under test and an external test instrument and the device under test is plugged into the test socket such that it is mounted thereon for testing.

4. A test apparatus for testing a device under test as claimed in claim 1, wherein the test apparatus increases the light transmission through the back surface of the device under test by matching the index of refraction of the heat transfer medium to the indices of refraction of the device under test and the observation window, by being selected to be between the indices of refraction of the device under test and the observation window.

5. A test apparatus for testing a device under test as claimed in claim 1, wherein the observation window is designed to pass radiation in the visible and near infrared portions of the spectrum while blocking radiation in the far infrared portions of the spectrum.

6. A test apparatus for testing a device under test as claimed in claim 1, wherein the test control fixture comprises an upper housing positioned on top of a lower housing, and the upper housing is sealed relative seal to the lower housing by a seal positioned therebetween and around the sealed test chamber.

7. A test apparatus for testing a device under test as claimed in claim 6, wherein the lower housing defines a lower rectangular box shaped recess, and an upper slightly larger, rectangular box shaped recess, the test mounting is fixedly mounted within the lower recess such that the device under test is mounted on the test mounting and extends into the upper recess through which the heat transfer medium flows.

8. A test apparatus for testing a device under test as claimed in claim 1, further including means for controlling the temperature of the heat transfer medium, wherein the temperature of the heat transfer medium is maintained relatively constant by a feedback control system for a heating/cooling unit.

9. A test apparatus for testing a device under test as claimed in claim 8, wherein the feedback control system includes a thermocouple positioned in the test chamber.

* * * * *

UNITED STATES PATENT AND TRADEMARK OFFICE
CERTIFICATE OF CORRECTION

PATENT NO.   : 6,191,599 B1
DATED        : February 20, 2001
INVENTOR(S)  : K.C. Walter Page 1 of 1

It is certified that error appears in the above-identified patent and that said Letters Patent is hereby corrected as shown below:

Column 2,
Line 40, -- economic -- should begin on the next line.

Column 5, claim 1,
Line 13, "surf side" should read -- opposite side --.

Signed and Sealed this

Eleventh Day of December, 2001

*Attest:*

NICHOLAS P. GODICI
*Attesting Officer*   *Acting Director of the United States Patent and Trademark Office*